United States Patent
Lee et al.

(10) Patent No.: US 8,232,029 B2
(45) Date of Patent: Jul. 31, 2012

(54) METHODS OF FABRICATING A PHOTOMASK AND USE THEREOF

(75) Inventors: MyoungSoo Lee, Suwon-si (KR); Byunggook Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/340,977

(22) Filed: Dec. 30, 2011

(65) Prior Publication Data

US 2012/0100468 A1 Apr. 26, 2012

Related U.S. Application Data

(63) Continuation of application No. 12/831,581, filed on Jul. 7, 2010, now Pat. No. 8,105,737.

(30) Foreign Application Priority Data

Oct. 26, 2009 (KR) .................. 10-2009-0101817

(51) Int. Cl.
*G03F 1/38* (2012.01)
*G03F 9/00* (2006.01)

(52) U.S. Cl. ............ 430/5; 430/30; 430/311; 430/322; 430/396; 430/945

(58) Field of Classification Search ................ 430/5, 30, 430/311, 322, 396, 945
See application file for complete search history.

(56) References Cited

U.S. PATENT DOCUMENTS

| | | |
|---|---|---|
| 6,291,119 B2 | 9/2001 | Choi et al. |
| 6,845,497 B2 | 1/2005 | Murai et al. |
| 7,241,539 B2 | 7/2007 | Kim et al. |
| 7,662,522 B2 | 2/2010 | Abe |
| 7,763,397 B2 | 7/2010 | Lee et al. |

FOREIGN PATENT DOCUMENTS

| | | |
|---|---|---|
| JP | 2004-048018 A | 2/2004 |
| KR | 10-2001-0069089 A | 7/2001 |
| KR | 10-2003-0040074 A | 5/2003 |
| KR | 10-2008-0078592 A | 8/2008 |

*Primary Examiner* — Christopher Young
(74) *Attorney, Agent, or Firm* — Lee & Morse, P.C.

(57) ABSTRACT

A method of correcting patterns includes attaining a correcting amount distribution map using a photo mask, the photo mask including a transparent substrate having first and second surfaces opposite to each other and a mask pattern on the first surface, attaining a plurality of shadowing maps based on the correction amount distribution map, each of the shadowing maps including a unit section having a different plane area, and forming a plurality of shadowing regions with shadowing elements in the transparent substrate of the photo mask using respective shadowing maps.

20 Claims, 12 Drawing Sheets

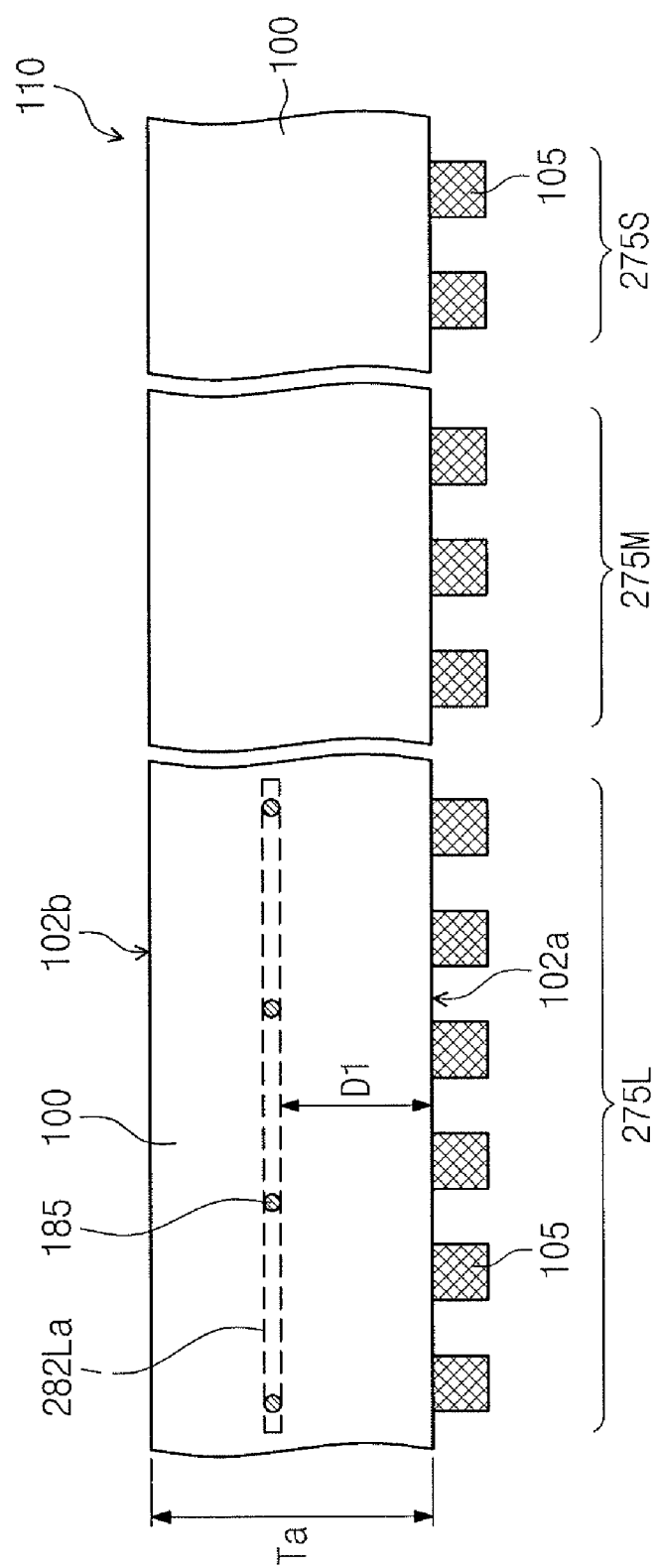

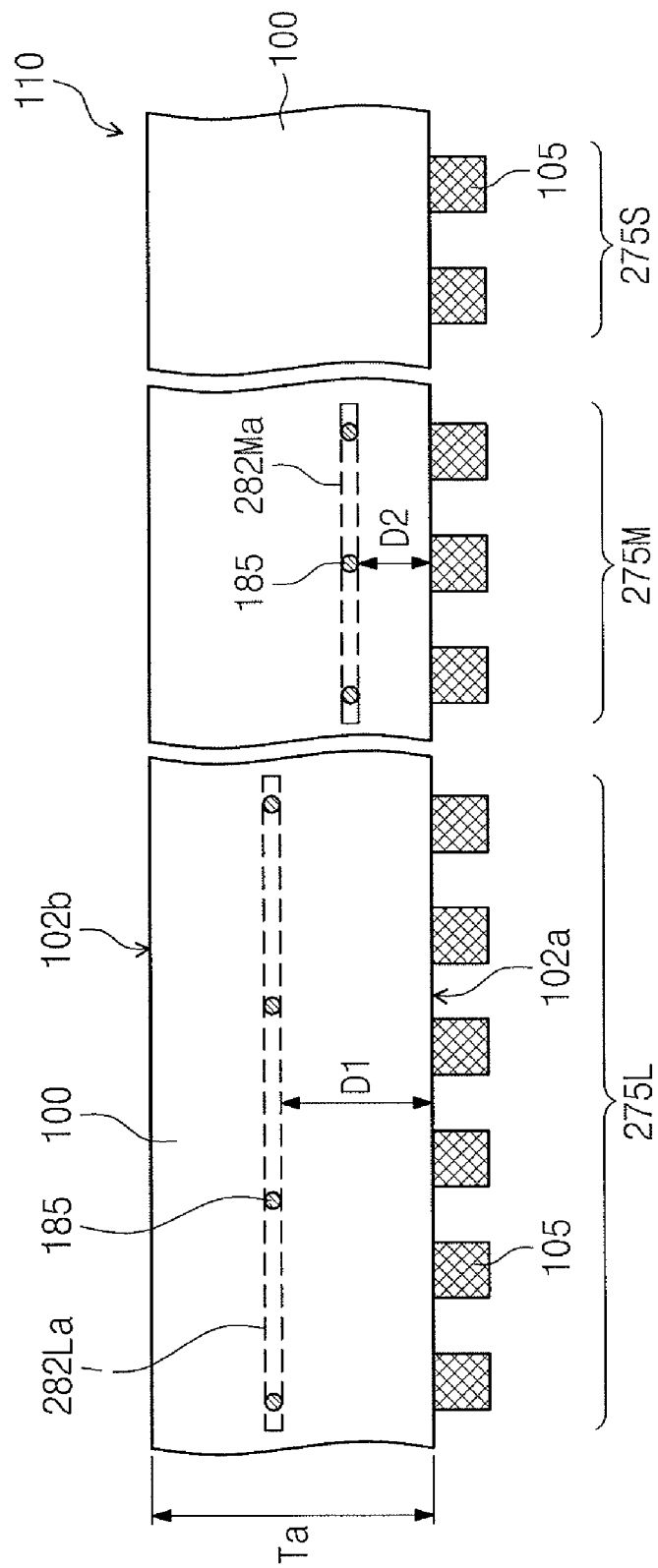

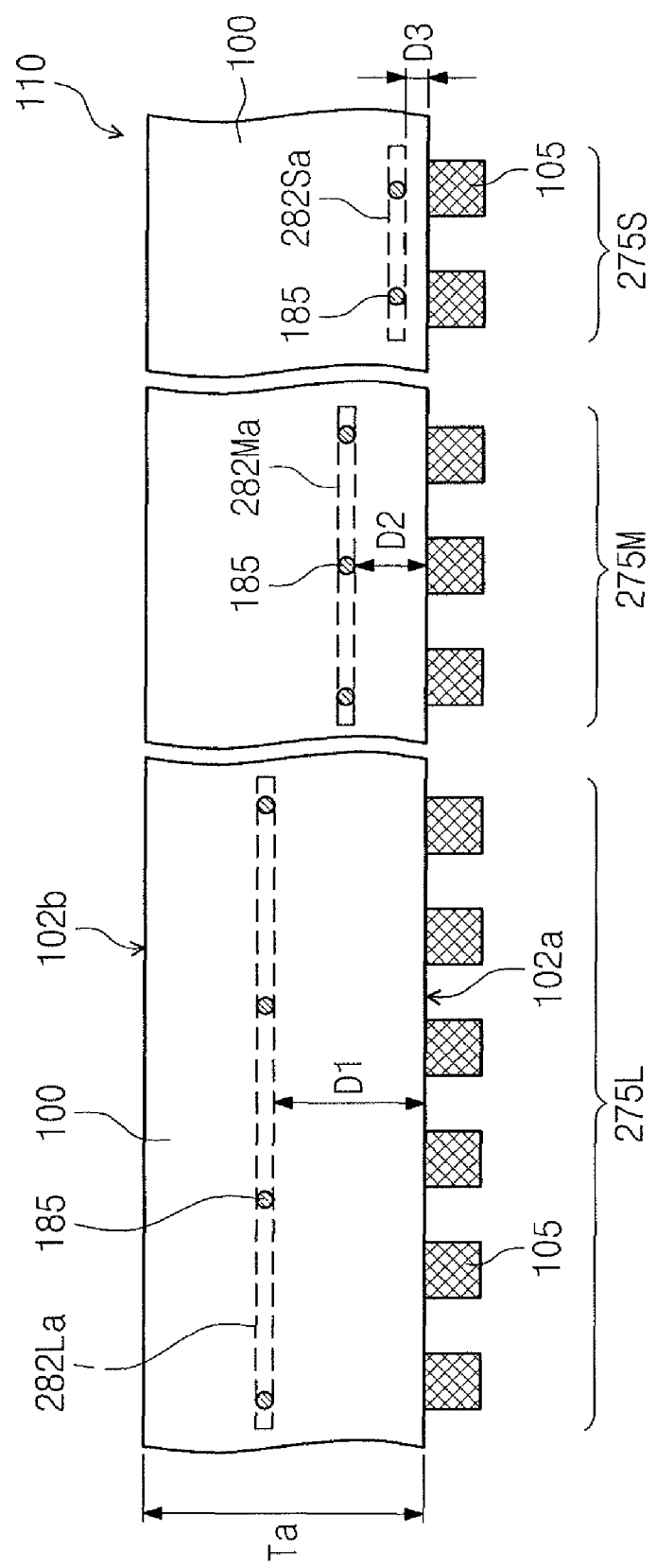

METHODS OF FABRICATING A PHOTOMASK AND USE THEREOF

CROSS REFERENCE TO RELATED APPLICATION(S)

This is a continuation application based on application Ser. No. 12/831,581, filed Jul. 7, 2010 now U.S. Pat. No. 8,105,737, the entire contents of which is hereby incorporated by reference.

BACKGROUND

1. Field

The inventive concepts herein relate to a method of correcting patterns, and more particularly, to a method of correcting patterns for a semiconductor device.

2. Description of the Related Art

When manufacturing a semiconductor device, a photolithography process may be performed to define fine patterns of the semiconductor device. A mask pattern of a photo mask is transferred to a photoresist layer on a substrate by a light source, thereby defining the fine patterns. However, the dimensions of the actual defined fine patterns on the substrate may vary from the original design dimensions, e.g., the dimensions may differ from each other depending on a location of the defined fine patterns. For example, while the light from the light source passes through the photo mask, the intensity of the light at different locations on the photo mask may vary by a variety of optical factors, thereby causing variation of the dimensions of the fine patterns. In addition, when a lens is disposed between the light source and the photo mask, the dimensions of the fine patterns may be further varied by roughness of a surface of the lens and/or aberration of the lens.

As design rules of the semiconductor devices are gradually reduced, non-uniformity of the dimensions of the patterns may increase. Therefore, a variety of ways for correcting the dimensions of the patterns have been researched.

SUMMARY

Embodiments are therefore directed to a method of correcting patterns for a semiconductor device, which substantially overcomes one or more of the problems due to the limitations and disadvantages of the related art.

It is therefore a feature of an embodiment to provide a method of correcting patterns, which can optimize the patterns for high integration.

It is therefore another feature of an embodiment to provide a method of correcting patterns, which can precisely correct the patterns.

It is yet another feature of an embodiment to provide a method of correcting patterns, which can reduce a correcting time for the patterns.

At least one of the above and other features and advantages may be realized by providing a method of correcting patterns. The method may include attaining a correcting amount distribution map using a photo mask, the photo mask including a transparent substrate having first and second surfaces opposite to each other and a mask pattern on the first surface, attaining a plurality of shadowing maps based on the correction amount distribution map, each of the shadowing maps including a unit section having a different plane area, and forming a plurality of shadowing regions with shadowing elements in the transparent substrate of the photo mask using respective shadowing maps. Attaining the plurality of shadowing maps may include attaining at least first and second shadowing maps, a plurality of unit sections in the first shadowing map having different area sizes than a plurality of unit sections in the second shadowing map.

In some embodiments, distances between the respective shadowing regions and the first surface may be different from each other.

In other embodiments, attaining the plurality of shadowing maps may include attaining at least first and second shadowing maps, unit sections in the first shadowing map having larger plane areas than unit sections in the second shadowing map, and the distance between the first surface and the shadowing region formed by the first shadowing map is greater than the distance between the first surface and the shadowing region formed by the second shadowing map.

In still other embodiments, the shadowing regions may include a first shadowing region and a second shadowing region. The first shadowing region may be spaced apart from the first surface by a first distance, the second shadowing region may be spaced apart from the first surface by a second distance less than the first distance. The second distance may be equal to or less than $1/6$ of a thickness of the transparent substrate.

In even other embodiments, the attaining of the plurality of the shadowing maps may comprise dividing the correction amount distribution map into a plurality of sub-maps, wherein the sub-maps include unit correction regions having different areas; determining a location of the shadowing region in the transparent substrate from the area of the unit correction region of each of the sub-maps; and determining a density of shadowing elements in the shadowing region from each of the sub-maps.

In yet other embodiments, when light for a photolithography process is directed to the second surface of the transparent substrate, intensity of the light transferred to the mask patterns overlapping with the shadowing regions may be reduced.

In further embodiments, a plane area of the each of the unit sections may be equal to or less than a spatial resolution of a shadowing element in the shadowing region formed by each of the unit section.

In still further embodiments, the shadowing element may have a different refractive index from the transparent substrate.

In still yet other embodiments, one of the shadowing maps may comprise a plurality of a plurality of the unit sections. The shadowing regions formed by one of the shadowing maps may be spaced apart from the first surface by a same distance.

In even yet other embodiments, the plurality of the shadowing regions formed by one of the shadowing maps may comprise at least two of the shadowing regions having different density of shadowing elements.

In even further yet other embodiments, the attaining of the correction amount distribution map may comprise defining the patterns by performing a photolithography process for a substrate using the photo mask having the mask patterns; and attaining the correction amount distribution map by calculating a dimension correction amount at each location from the defined patterns and design patterns.

In even yet other embodiments, the method may further comprise performing a photolithography process for a substrate using the photo mask having the shadowing regions formed by the shadowing maps.

In even further yet other embodiments, light is inclined incident on the second surface of the photo mask in the photolithography process.

BRIEF DESCRIPTION OF THE DRAWINGS

The above and other features and advantages will become more apparent to those of ordinary skill in the art by describing in detail exemplary embodiments with reference to the attached drawings, in which:

FIGS. 9A-9C illustrate cross-sectional views of a method for forming shadowing regions using the shadowing maps of FIGS. 8A-8C, respectively.

DETAILED DESCRIPTION

Figure 1:
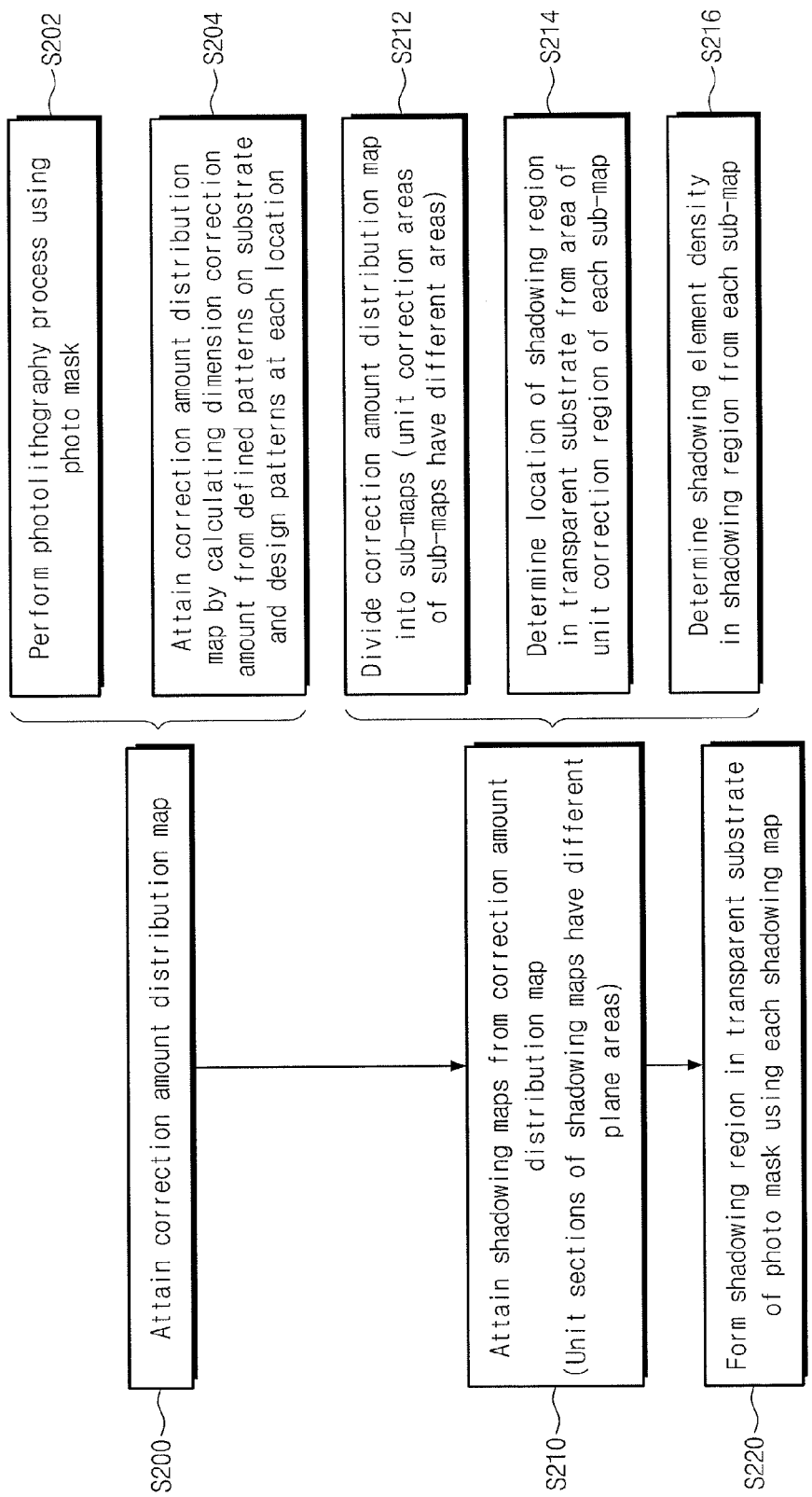
FIG. 1 illustrates a flowchart of a method of correcting patterns according to exemplary embodiments of the inventive concept.

Korean Patent Application No. 10-2009-0101817, filed on Oct. 26, 2009, in the Korean Intellectual Property Office, and entitled: "Method of Correcting Patterns for Semiconductor Device," is incorporated by reference herein in its entirety.

Exemplary embodiments will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the drawings, the dimensions of layers and regions are exaggerated for clarity of illustration. It will also be understood that when a layer (or element) is referred to as being 'on' another layer or substrate, it can be directly on the other layer or substrate, or intervening layers may also be present. Further, it will be understood that when a layer is referred to as being 'under' another layer, it can be directly under, or one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, exemplary embodiments of the inventive concept will be described based on a flowchart of FIG. 1. Each process of the flowchart of FIG. 1 will be more clearly described with reference to FIGS. 2 to 9.

Figure 2:
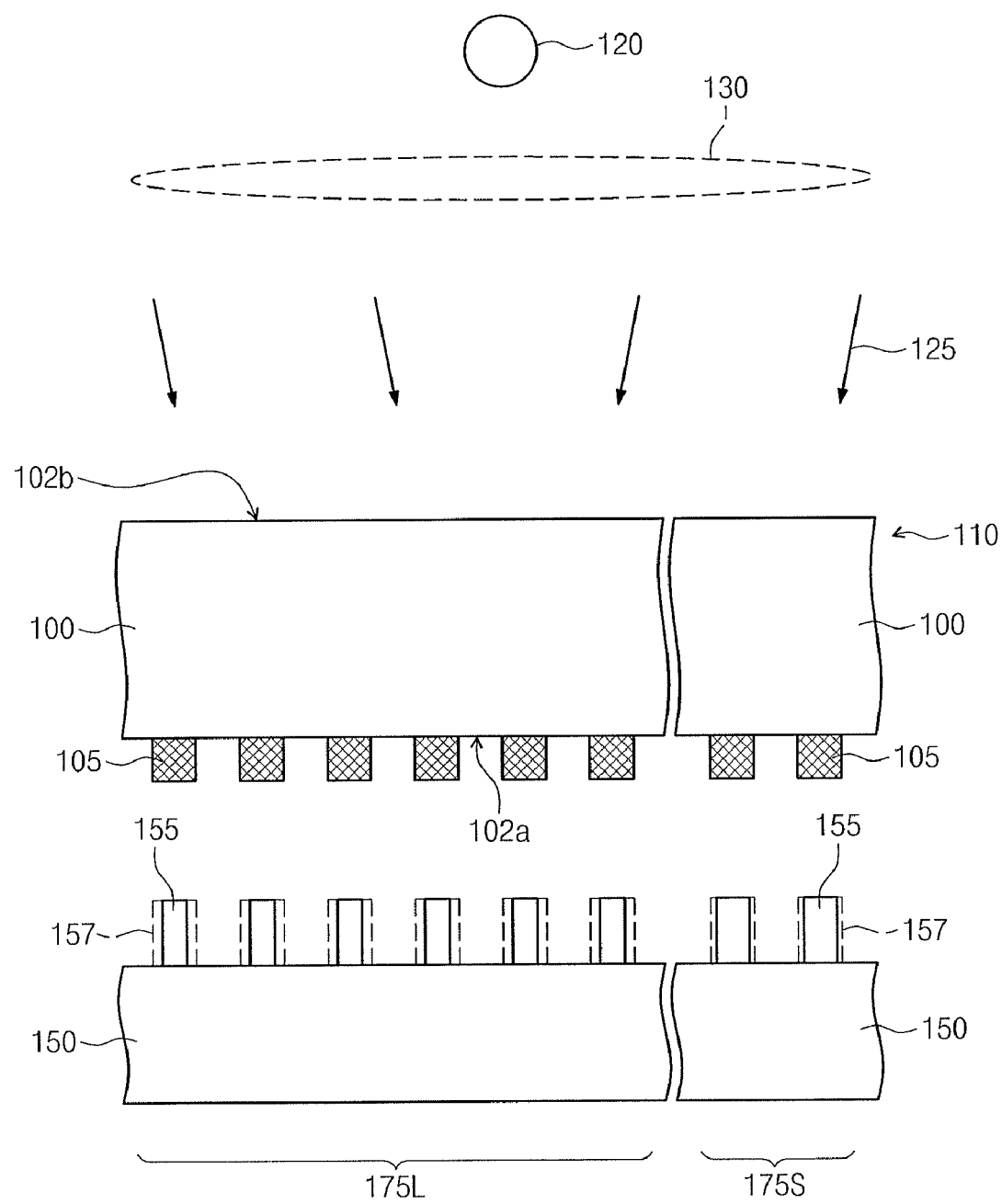
FIG. 2 illustrates a cross-sectional view of a method of attaining a correction amount distribution map in the method of correcting patterns according to exemplary embodiments of the inventive concept.
Figure 3:
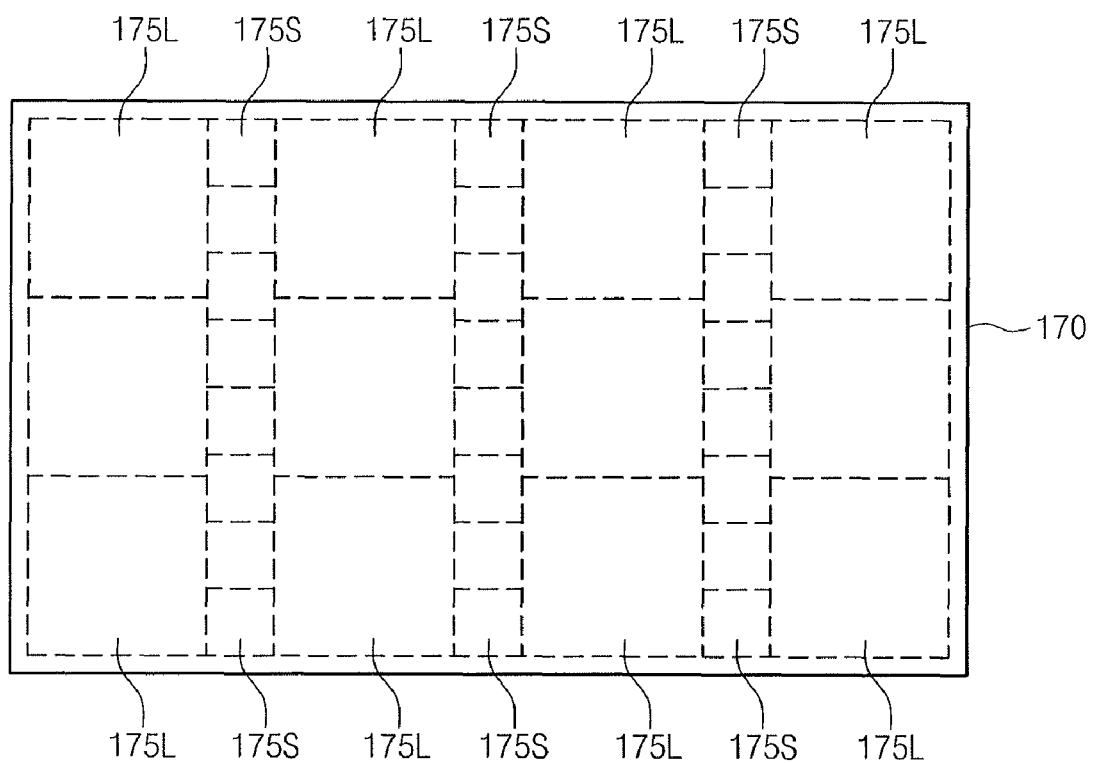
FIG. 3 illustrates a top-plan view of a correction amount distribution map according to one embodiment of the inventive concept.

FIG. 1 illustrates a flowchart of a method of correcting patterns according to exemplary embodiments. FIG. 2 illustrates a cross-sectional view of a method of attaining a correction amount distribution map in the method of correcting patterns according to exemplary embodiments. FIG. 3 illustrates a top-plan view of a correction amount distribution map according to an embodiment.

First, referring to FIGS. 1 to 3, a correction amount distribution map may be attained (S200). Reference numeral 170 in FIG. 3 indicates a correction amount distribution map 170. A method for attaining the correction amount distribution map 170 will now be described.

Referring to FIGS. 1-2, a photolithography process may be performed using a photo mask 110, i.e., operation S202 in FIG. 1. As illustrated in FIG. 2, the photo mask 110 may include a transparent substrate 100 through which light can pass. The transparent substrate 100 may include first and second surfaces 102a and 102b opposite to each other. The photo mask 110 may include mask patterns 105 on the first surface 102a. The mask patterns 105 may be transferred to a substrate 150 to define fine patterns in a semiconductor device. The mask patterns 105 may be formed of a material that can fully block the light or a half tone blocking material. The following will describe a method for performing the photolithography process using the photo mask 110 with reference to FIG. 2.

Referring to FIG. 2, the photo mask 110 may be first mounted on a photolithography system. The photolithography system may include a chuck (not shown) on which the substrate 150 for the semiconductor device is installed and a light source 120. The light source 120 generates light for the photolithography process. The light source 120 may be disposed above the chuck. The photo mask 110 may be disposed on the substrate 150 on the chuck. The first surface 102a of the transparent substrate 100 may be oriented toward, e.g., may face, the substrate 150, and the second surface 102b may be oriented toward the light source 120. A condenser lens 130 may be disposed between the light source 120 and the photo mask 110.

The light irradiated from the light source 120 is incident on the second surface 102b of the transparent substrate 100 via the condenser lens 130. The irradiated light 125 may be directed in an inclined direction with respect to the second surface 102b. For example, vertical components of the light from the light source 120, i.e., light incident perpendicularly to the second surface 102b, are blocked by apertures and the like, and inclined components of the irradiated light 125 are incident on the second surface 102b.

The irradiated light 125 passing through the photo mask 110 is incident on a photoresist layer (not shown) coated on the substrate 150 to define the patterns 155 on the substrate 150. In more detail, the irradiated light 125 passing through the photo mask 110 is incident on the photoresist layer of the substrate 150, after which a developing process for the substrate 150 is performed to define the patterns 155 on the substrate 150. In FIG. 2, for descriptive convenience, the substrate 150 and the photo mask 110 that have gone through the developing process are illustrated in arrangement.

Referring to FIGS. 1 to 3, after performing the photolithography process using the photo mask 110, the correction amount distribution map 170 may be attained by calculating dimension correction amounts at respective locations from the patterns 155 defined on the substrate 100 and design patterns 157, i.e., operation S204 in FIG. 1. A dotted-line in FIG. 2 indicates the design patterns 157 for the semiconductor device. The dimension difference between the defined patterns 155 and the design patterns 157 corresponding to the defined patterns 155 may be calculated, and the correction amount distribution map 170 may be attained from the dimension difference and the locations of the mask patterns 105 corresponding to the respective design patterns 157. The correction amount distribution map 170 corresponds to a distribution map representing the dimension correction amount according to the location of the photo mask 110. That is, dimensions of the formed patterns 155 may be compared to dimensions of the design patterns 157, i.e., originally intended design dimensions, so the correction amount distribution map 170 may reflect correction amounts required for the patterns 155 in order to achieve the design pattern 157. Further, the correction amount distribution map 170 may reflect the arrangement and configuration of the defined pattern 155 on the substrate 150, so the dimension correction amounts of the defined patterns 155 may depend on a specific location of each defined pattern 155 on the substrate 150, as well as on its deviation from a respective design pattern 157.

Figure 4A:
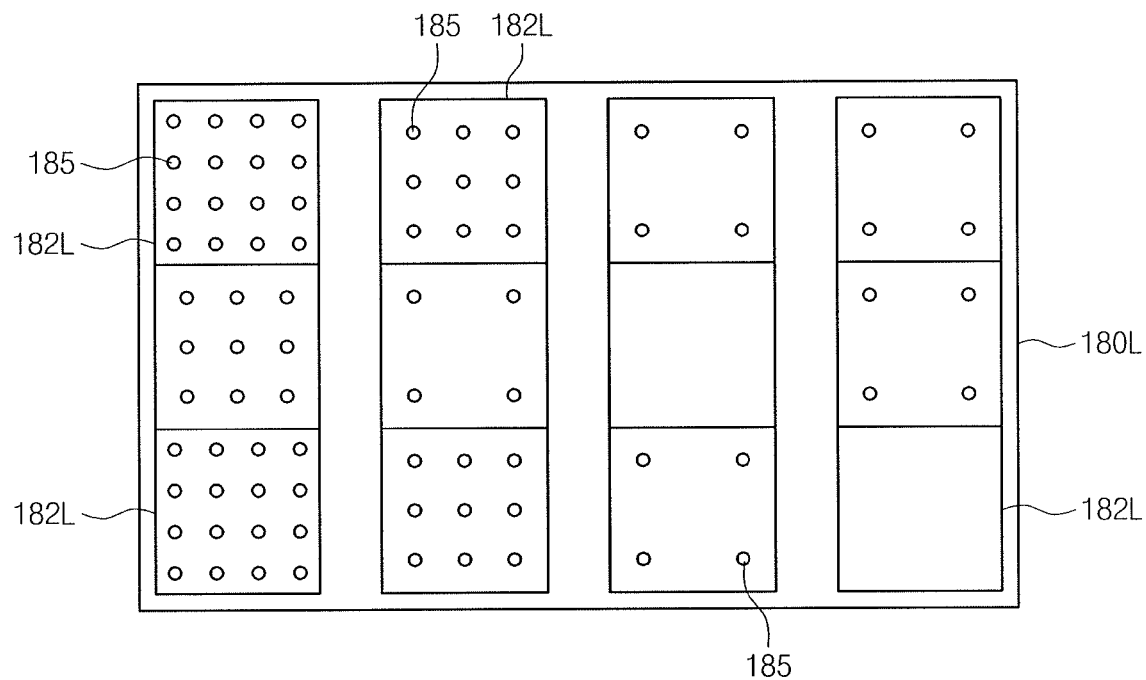
FIGS. 4A and 4B illustrate top-plan views of a plurality of shadowing maps corresponding to the correction amount distribution map of FIG. 3.
Figure 4B:
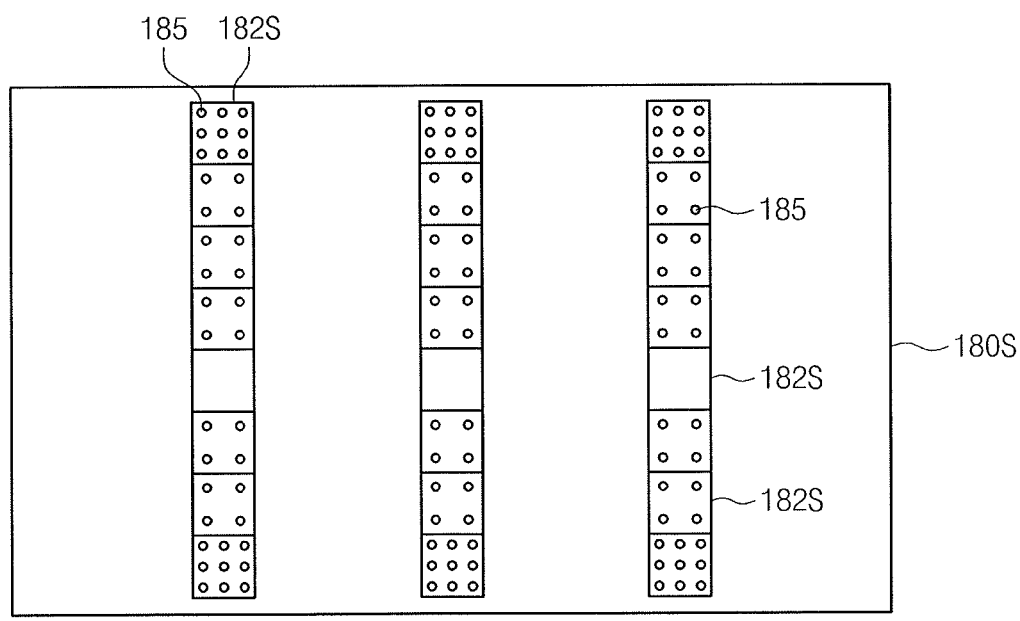

Once the correction amount distribution map 170 is attained in operation S200 of FIG. 1, a plurality of shadowing maps may be attained from the correction amount distribution map 170, i.e., operation S210 in FIG. 1. The shadowing maps may be formed in accordance with, i.e., based on, the correction amount distribution map 170 to facilitate dimension correction of the defined patterns 155 on the substrate 150 in a subsequent operation. The shadowing maps are shown in FIGS. 4A and 4B, and operation S210 will be described in more detail with reference to FIGS. 4A and 4B. FIGS. 4A and 4B illustrate top-plan views of a plurality of shadowing maps corresponding to the correction amount distribution map 170 of FIG. 3.

Referring to FIGS. 4A and 4B, each of the shadowing maps may correspond to a different region of the defined patterns 155 on the substrate 150. For example, referring to FIGS. 4A-4B, the shadowing maps may include first and second shadowing maps 180L and 180S, and each of the first and second shadowing maps 180L and 180S may include a plurality of first unit sections 182L and second unit sections 182S, respectively. The first unit sections 182L of the first shadowing map 180L may have different plane areas, i.e., sizes, as compared to the second unit sections 182S of the second shadowing map 180S, e.g., the first unit sections 182L may have a greater plane area than the second unit section 182S. Further, the first unit sections 182L may have a different number and a different arrangement within the first shadowing map 180L, as compared to the second unit sections 182S of the second shadowing map 180S.

The first and second shadowing maps 180L and 180S may be used to form respective shadowing regions 182La and 182Sa in the transparent substrate 100 (see FIG. 5B) to facilitate correction of dimensions of the defined pattern 155 on the substrate 150. The plane area, i.e., area size, and location of the first shadowing region 182La in the transparent substrate 100 may be determined by the plane area and arrangement of the first unit sections 182L in the first shadowing map 180L. Similarly, the plane area and location of the second shadowing region 182Sa in the transparent substrate 100 may be determined by the plane area and arrangement of the second unit sections 182S in the second shadowing map 180S. In detail, the first and second unit sections 182L and 182S may include shadowing elements 185 determined by the correction amount distribution map 170, so density of the shadowing elements 185 in each of the first unit sections 182L and each of the second unit sections 182S, i.e., in accordance with the correction amount distribution map 170, may control light incident on the substrate 150 through the first and second shadowing regions 182La and 182Sa of the transparent substrate 100 in order to correct dimensions of the defined patterns 155.

The following will describe the method for attaining the first and second shadowing maps 180L and 180S, i.e., operation S210 in FIG. 1, in more detail.

Referring to FIG. 1, the correction amount distribution map 170 may be divided into a plurality of sub-maps, i.e., operation S212 in FIG. 1. That is, as illustrated in FIG. 3, each sub-map of the correction amount distribution map 170 may include a plurality of first unit correction regions 175L and a plurality of second unit correction regions 175S. At this point, the first and second unit correction regions 175L and 175S of the sub-maps may have different areas, e.g., the first unit correction region 175L may have a larger area than the second unit correction region 175S. The variation of the dimension correction amount in accordance with the location in the first unit correction region 175L may be gradual. Further, when at least some of the first unit correction regions 175L contact each other with a boundary, the variation of the dimension correction amount between the some of the first unit correction regions 175L adjacent to the boundary may also be gradual. In other words, variation of the dimension correction amount between adjacent first unit correction regions 175L may be gradual. Similarly, when at least some of the second unit correction regions 175S contact each other with a boundary, the variation of the dimension correction amount between the some of the second unit correction regions 175S adjacent to the boundary may also be gradual. On the other hand, when the first unit correction region 175L is shifted to the second unit correction region 175S, the variation of the dimension correction amount at the boundary between the first and second unit correction regions 175L and 175S may be sharp. That is, variation of the dimension correction amount between adjacent first and second unit correction regions 175L and 175S may not be gradual.

Once the correction amount distribution map 170 is divided into a plurality of sub-maps in operation S212, the location of the shadowing regions 1802La and 182Sa in the transparent substrate 100 may be determined from the area of the unit correction regions 175L and 175S of each sub-map, i.e., operation S214 in FIG. 1. That is, referring to FIGS. 3 and 4A-4B, the first unit sections 182L of the first shadowing map 180L may be determined by the first unit correction regions 175L of the first sub-map. Similarly, the second unit sections 182S of the second shadowing map 180S may be determined by the second unit correction regions 175S of the second sub-map. For example, an area of the first unit correction region 175L may be the same as the plane area of the first unit section 182L. An area of the second unit correction region 175S may be the same as the plane area of the second unit section 182S. The location of the shadowing region in the transparent substrate 100 will be described in more detail with reference to FIG. 5B.

Figure 5A:
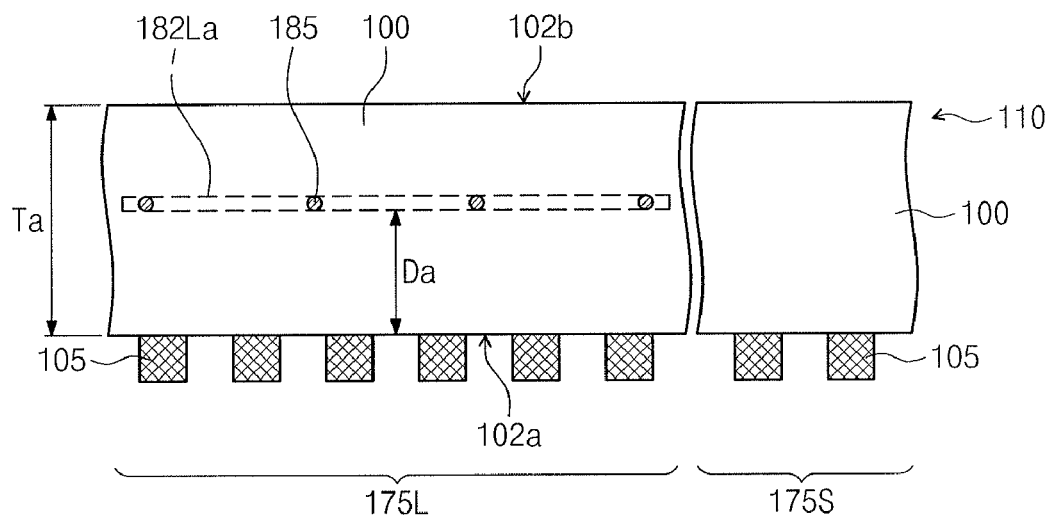
FIGS. 5A and 5B illustrate cross-sectional views of a method for forming shadowing regions using the shadowing maps of FIGS. 4A and 4B.
Figure 5B:
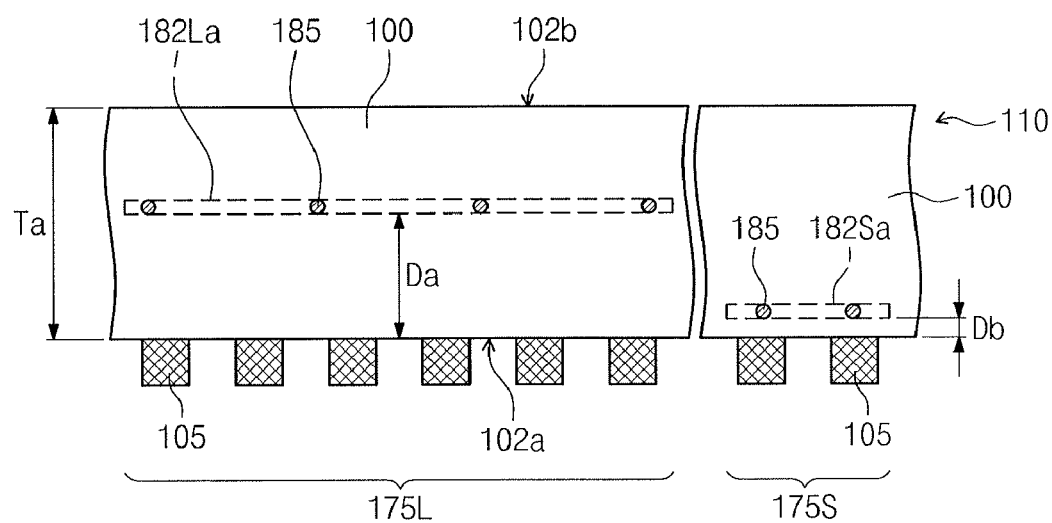

Referring to FIG. 5B, the first and second shadowing regions 182La and 182Sa that will be formed in accordance with respective first and second unit correction regions 175L and 175S may be located in the transparent substrate 100 of the photo mask 110. The plane area of the first shadowing region 182La may be the same as the area of the first unit correction region 175L (or the plane area of the first unit section 182L). The plane area of the second shadowing region 182Sa may be the same as the area of the second unit correction region 175S (or the plane area of the second unit section 182S).

The first shadowing region 182La having a relatively lager area than the second shadowing region 182Sa may be spaced apart from the first surface 102a of the transparent substrate 100 by a first distance Da. The second shadowing region 182Sa having a relatively smaller area may be spaced apart from the first surface 102a of the transparent substrate 100 by a second distance Db. At this point, the second distance Db may be smaller than the first distance Da. That is, the second shadowing region 182Sa may be closer to the first surface 102a than the first shadowing region 182La. The first shadowing region 182La may be substantially parallel with the first surface 102a. The first distance Da may correspond to a distance between the first surface 102a and the first shadowing region 182La. Likewise, the second shadowing region 182Sa may be substantially parallel with the first surface 102a. The second distance Db may correspond to a distance between the first surface 102a and the second shadowing region 182Sa.

Referring to FIGS. 1, 3, 4A, and 4B, the densities of the shadowing elements 185 of the shadowing region from each sub-map may be determined, i.e., operation S216 in FIG. 1. As described above, the first sub-map may include the plurality of the first unit correction regions 175L. Some of the first unit correction regions 175L may require a same dimension correction amount, thereby having a same shadowing element density. On the other hand, some of the first unit correction regions 175L may require different dimension correction amounts, thereby having different shadowing element densities. The shadowing element densities of the respective first unit correction regions 175L are marked in the first unit sections 182L of the first shadowing map 180L, thereby completing the first shadowing map 180L. For example, as illustrated in FIG. 4A, the first and third first unit sections 182L in the left column may have a same number of shadowing elements 185, e.g., sixteen elements, while the second first unit section 182L in the left column may have a different number of shadowing elements 185, e.g., nine elements. In another example, some of the first unit correction regions 175L may not require a dimension correction, thereby having a shadowing element density of zero, i.e., no shadowing elements 185.

As the density of the shadowing elements increases, a reduction amount of intensity of light transferred to the mask patterns overlapping with the shadowing region may gradually increase. In addition, as the density of the shadowing elements decreases, a reduction amount of intensity of light transferred to the mask patterns overlapping with the shadowing region may gradually decrease. In other words, a change in the density of the shadowing elements may control the amount and intensity of light transmitted through the photo mask 110 to the defined patterns 155 on the substrate 150, so the density of the shadowing elements in the photo mask 110 may be adjusted in accordance with the correction amount distribution map 170 in order to correct the dimensions of the defined patterns 155.

Likewise, the second sub-map may include the plurality of the second unit correction regions 175S. At least some of the second unit correction regions 175S may have a same shadowing element density, and some of the second unit correction regions 175S may have different shadowing element densities. At least one of the second unit correction regions 175S may have a shadowing element density of zero. The required shadowing element densities of the respective second unit correction regions 175S are marked in the second unit sections 182S of the second shadowing map 180S in FIG. 4B, thereby completing the second shadowing map 180S. As described above, the first and second shadowing maps 180L and 180S may be attained through the above-described operations S212-S216.

Once the first and second shadowing maps 180L and 180S are complete, the first and second shadowing regions may be formed in the transparent substrate 100 of the photo mask 110 by using the respective first and second shadowing maps 180L or 180S, i.e., operation S220 in FIG. 1. FIGS. 5A and 5B illustrate cross-sectional views of a method for forming the first and second shadowing regions 180La and 180Sa using the shadowing maps of FIGS. 4A and 4B.

Referring to FIGS. 1, 4A, and 5B, the shadowing elements 185 may be formed in the transparent substrate 100 of the photo mask 110 in accordance with the first shadowing map 180L. Accordingly, the first shadowing region 182La having the shadowing elements 185 may be formed. The first shadowing region 182La may be formed in the transparent substrate 100 and may be spaced apart from the first surface 102a by the first distance Da. The plane area of the first shadowing region 182La may be the same as that of the first unit section 182L of the first shadowing map 180L.

The shadowing elements 185 may have a different refractive index from the transparent substrate 100. For example, the shadowing elements 185 may have a greater refractive index than the transparent substrate 100. For example, the shadowing elements 185 may be formed in the transparent substrate 100 by irradiating laser light. At this point, a portion of the transparent substrate 100, to which the laser light is irradiated, may be preferably not molten and/or vaporized. The portion (a first portion) of the transparent substrate 100, to which the laser light is irradiated, may have a different crystal structure from the other portion (a second portion). For example, one of the first and second portions may be in an amorphous state and the other may be in a crystalline state.

As shown in FIG. 4A, the first shadowing map 180L may include the plurality of the first unit sections 182L. Accordingly, a plurality of shadowing regions 182La corresponding to the plurality of the first unit sections 182L may be formed in the transparent substrate 100. In a top view, the first shadowing regions 182La may have a same arrangement in the transparent substrate 100 as the first unit sections 182L of the first shadowing map 180L of FIG. 4A. The first shadowing regions 182La may be arranged at the first distance Da from the first surface 102a. For simplicity, FIG. 5A illustrates only one first shadowing region 182La formed in accordance with one first unit section 182L. Each of the first shadowing regions 182La may have a predetermined shadowing element density in accordance with respective shadowing elements 185 in FIG. 4A.

When the light is incident on the second surface 102b of the transparent substrate 100, a spatial resolution of the shadowing elements 185 in the transparent substrate 100 may be proportional to the distance between the shadowing elements 185 and the first surface 102a. The shadowing elements 185 in the first shadowing region 182La may have a first spatial resolution corresponding to the first distance Da. The plane area of the first unit section 182L may be the same as or smaller than the first spatial resolution.

Referring to FIGS. 1, 4B, and 5B, the shadowing elements 185 may be formed in the transparent substrate 100 of the photo mask 110 in accordance with the second shadowing map 180S, thereby forming the second shadowing region 182Sa having the shadowing elements 185. The second shadowing regions 182Sa in the transparent substrate 100 may be spaced apart from the first surface 102a by the second distance Db. The second shadowing region 182Sa may have a same plane area as the second unit section 182S of the second shadowing map 180S. The second shadowing region 182Sa may have a smaller plane area than the first shadowing region 182La. Accordingly, the second distance Db may be smaller than the first distance Da. The second distance Db may be equal to or smaller than about ⅙ of a thickness Ta of the transparent substrate 100.

The shadowing elements 185 in the second shadowing region 182Sa may have a same property as the shadowing elements 185 of the first shadowing region 182La. The shadowing elements 185 in the second shadowing region 182Sa may be also formed using a laser. As shown in FIG. 4B, the second shadowing map 180S may include the plurality of the second unit sections 182S. Accordingly, the plurality of the second shadowing regions 182Sa may be formed in the transparent substrate 100. In a top view, the second shadowing regions 182Sa may have a same arrangement as the second unit sections 182S of the second shadowing map 180S of FIG. 4B. The second shadowing regions 182Sa may be arranged at a same distance (the second distance Db) from the first surface 102a. For simplicity, in FIG. 5B, only one second shadowing region 192Sa is illustrated. Each of the second shadowing regions 182Sa may have a predetermined shadowing element density in accordance with respective shadowing elements 185 in FIG. 4B.

The shadowing elements 185 in the second shadowing region 182Sa may have a second spatial resolution corresponding to the second distance Db. The plane area of the second unit section 182S defining the plane area of the second shadowing region 182Sa may be equal to or smaller than the second spatial resolution. The second spatial resolution may be smaller than the first spatial resolution of the shadowing elements 185 in the first shadowing region 182La. That is, the second spatial resolution may be more precise than the first spatial resolution.

As described above, the first and second shadowing regions 180La and 180Sa may be formed in the transparent substrate 100 by sequentially using the first and second shadowing maps 180L and 180S, respectively. After forming the first shadowing region 180La, the second shadowing region 180Sa may be formed. Alternatively, after forming the second shadowing region 180Sa, the first shadowing region 180La may be formed.

Figure 6:
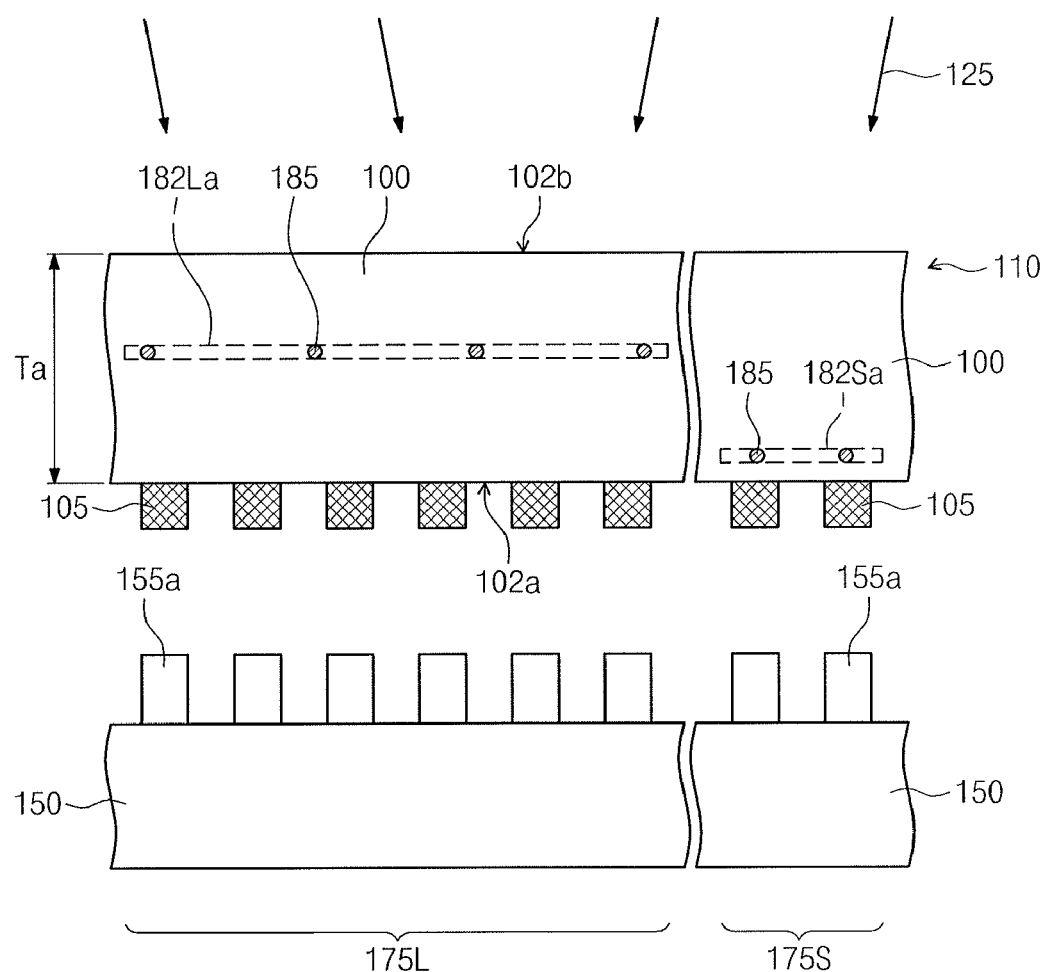
FIG. 6 illustrates a cross-sectional view of a photolithography process using a corrected photo mask according to one exemplary embodiment of the inventive concept.

Next, the photolithography process may be performed using the photo mask 110 having the first and second shadowing regions 180La and 180Sa. This will be described with reference to FIG. 6. FIG. 6 illustrates a cross-sectional view of a photolithography process using a corrected photo mask according to an exemplary embodiment.

Referring to FIG. 6, the photo mask 110 having the first and second shadowing regions 180La and 180Sa may be mounted on the photolithography system, and the substrate 150, onto which the photoresist layer is coated, may be loaded on the photolithography system. The first surface 102a of the photo mask 110 may be oriented toward the substrate 150. Next, light 125 may be incident on the second surface 102b of the photo mask 110 to transfer the mask patterns 105 of the photo mask 110 to the substrate 150, thereby defining patterns 155a.

The dimensions of the defined patterns 155a may be corrected by reducing the intensity of the light incident on the first and second shadowing regions 180La and 180Sa. The reduction amount of the light intensity may be controlled by the shadowing element densities of the first and second shadowing regions 180La and 180Sa.

The dimensions of the defined patterns 155a may be corrected by the first and second shadowing regions 180La and 180Sa. In addition, the dimensions of the mask patterns 105 of the photo mask 110 may also be corrected by the shadowing regions 180La and 180Sa. That is, when the mask patterns 105 of the photo mask 110 having the shadowing regions 180La and 180Sa are measured using an apparatus for measuring the dimensions of the mask patterns 105 by directing an optical signal to the second surface 102b, the dimensions of the mask patterns 105 of the photo mask 110 having the shadowing regions 180La and 180Sa may be corrected. That is, the dimensions of the patterns 155a for the semiconductor device or the mask patterns 105 can be efficiency corrected by the shadowing regions 180La and 180Sa.

According to the above-described pattern correcting method, the first and second shadowing maps 180L and 180S may be attained from the correction amount distribution map 170. At this point, the first and second unit sections 182L and 182S of the shadowing maps 180L and 180S may have different plane areas. Therefore, the patterns for the semiconductor device may be corrected at respective locations with improved precision. In addition, the correction time of the patterns may be minimized, thereby improving the correction throughput.

In contrast, when there are correction regions having different area sizes, but the correction is performed using unit sections having a same area size, many problems may occur. For example, when only unit sections having a larger spatial resolution are used, the correction regions having smaller areas than the spatial resolution may not be accurately corrected. In another example, when only unit sections having a smaller spatial resolution are used, the correction time may significantly increase, and thus, the correction throughput may be deteriorated. However, according to the exemplary embodiment of the inventive concept, the first and second shadowing maps 180L and 180S corresponding to the respective correction regions having different area sizes may be first attained, and the patterns may be corrected using the first and second shadowing maps 180L and 180S. Therefore, precise correction may be performed for all of the patterns, and the correction time may be minimized to improve the correction throughput.

In the above-described embodiment, two shadowing maps were attained from the correction amount distribution map, and the patterns were corrected using the two shadowing maps. However, the inventive concept is not limited thereto. That is, more than two shadowing maps may be used. This will be described hereinafter with reference to the accompanying drawings. For simplicity, the portions that are previously described will be omitted in the following description.

Figure 7:
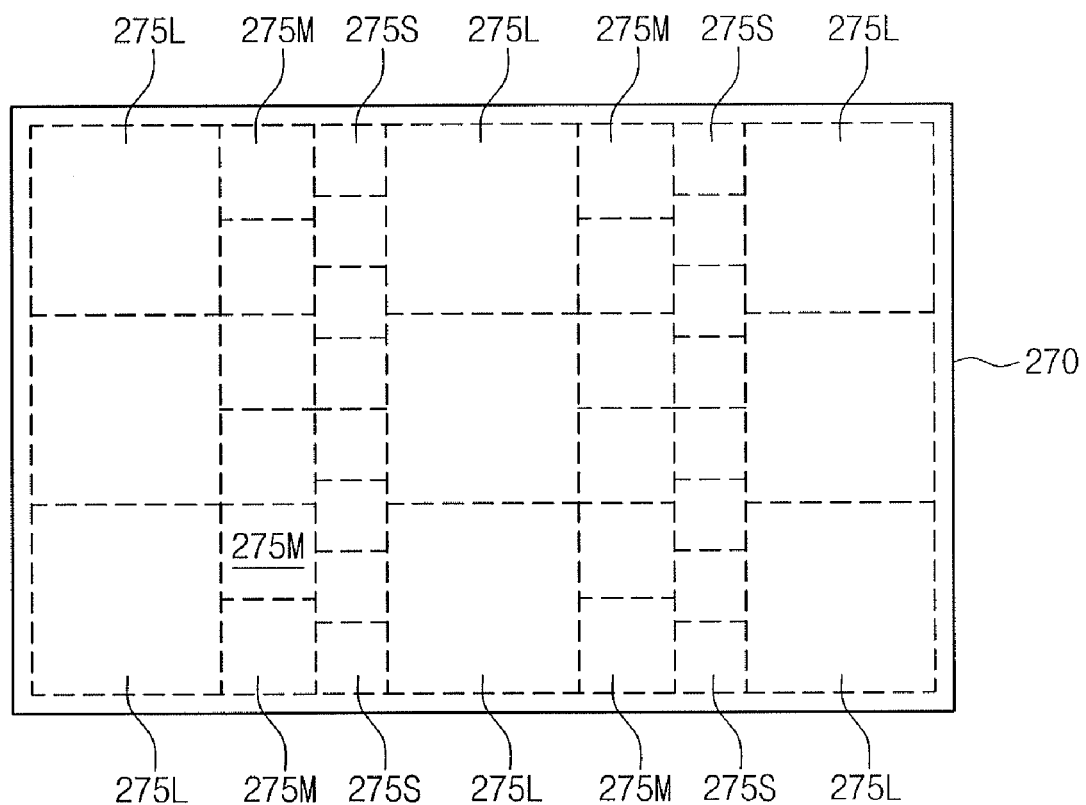
FIG. 7 illustrates a top-plan view of a correction amount distribution map according to another exemplary embodiment of the inventive concept.
Figure 8A:
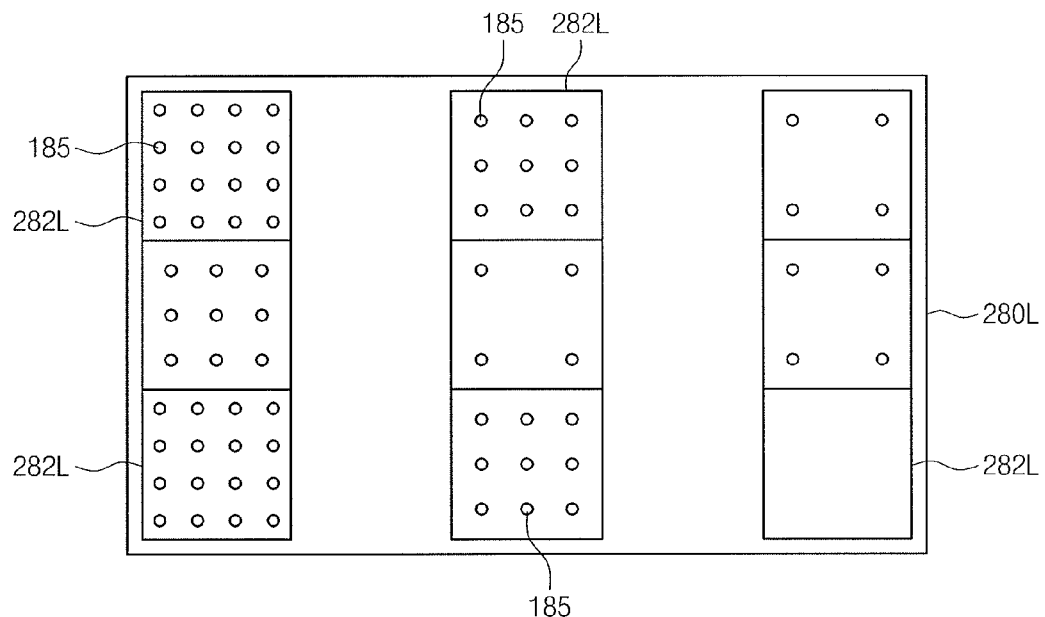
FIGS. 8A-8C illustrate top-plan views of a plurality of shadowing maps corresponding to the correction amount distribution map of FIG. 7.
Figure 8B:
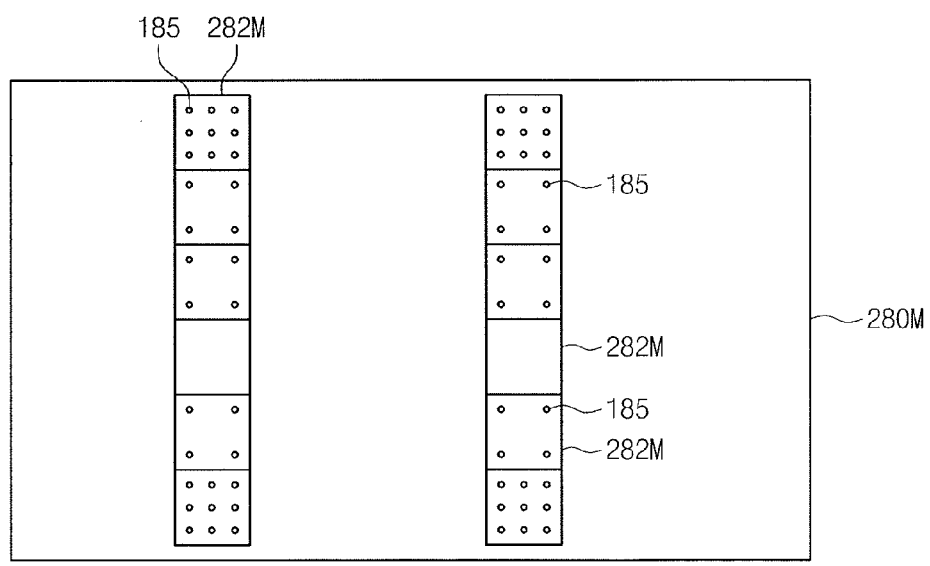
Figure 8C:
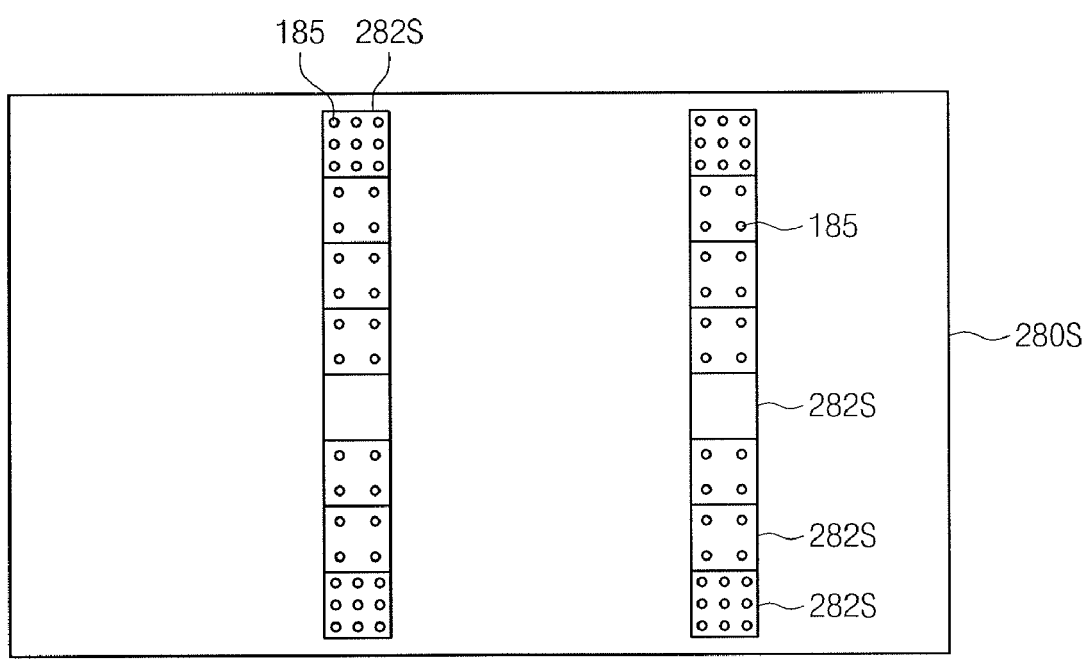

FIG. 7 illustrates a top-plan view of a correction amount distribution map according to another exemplary embodiment. FIGS. 8A-8C illustrate top-plan views of a plurality of shadowing maps corresponding to the correction amount distribution map of FIG. 7.

Referring to FIGS. 1, 7, and 8A-8C, a correction amount distribution map 270 may be attained through operations 5202-S204. The correction amount distribution map 270 may correspond to a distribution map representing a dimension correction amount in accordance with the location of the photo mask. First, second, and third shadowing maps 280L, 280M, and 280S may be attained from the correction amount distribution map 270. The first shadowing map 280L may include a first unit section 282L. The second shadowing map 280M may include a second unit section 282M. The third shadowing map 280S may include a third unit section 282S. The unit sections 282L, 282M, and 282S of the shadowing maps 280L, 280M, and 280S may have different plane areas, i.e., different area sizes. That is, the first unit section 282L may have a greater plane area than the third unit section 282S. The second unit section 282M may have a smaller plane area than the first unit section 282L and a greater plane area than the third unit section 282S. The first shadowing map 280L may include a plurality of the first unit sections 282L. The second shadowing map 280M may include a plurality of the second unit sections 282M. The third shadowing map 280S may include a plurality of the third unit sections 282S.

A first shadowing region 282La (FIG. 9A) may be defined by the first shadowing map 280L. A second shadowing region 282Ma (FIG. 9B) may be defined by the second shadowing map 280M. A third shadowing region 282Sa (FIG. 9C) may be defined by the third shadowing map 280S. A plane area and location of the first shadowing region 282La (FIG. 9A) in the transparent substrate may be determined by the plane area of the first unit section 282L. A plane area and location of the second shadowing region 282Ma (FIG. 9B) in the transparent substrate may be determined by the plane area of the second unit section 282M. A plane area and location of the third shadowing region 282Sa (FIG. 9C) in the transparent substrate may be determined by the plane area of the third unit section 282S. Densities of shadowing elements 185 in the first, second, and third unit sections 282L, 282M, and 282S may be determined by the correction amount distribution map 270.

The following will describe a method for attaining the shadowing maps 280L, 280M, and 280S in more detail.

The correction amount distribution map 270 may be divided into a plurality of sub-maps (S212). Each of the sub-maps may include a unit correction region 275L, 275M, 275S. At this point, the unit correction regions 275L, 275M, and 275S of the sub-maps may have different areas, i.e., area sizes. In this embodiment, the correction amount distribution map 270 may be divided into a first sub-map having the first unit correction region 275L, a second sub-map having the second unit correction region 275M, and a third sub-map having the third unit correction region 275S. The first unit section 282L of the first shadowing map 280L may be determined by the first unit correction region 275L of the first sub-map. The second unit section 282M of the second shadowing map 280M may be determined by the second unit correction region 275M of the second sub-map. The third unit section 282S of the third shadowing map 280S may be determined by the third unit correction region 275S of the third sub-map. For example, the area of the first unit correction region 275L may be the same as the plane area of the first unit section 282L. The area of the second unit correction region 275M may be the same as the second unit section 282M. The area of the third unit correction region 275S may be the same as the plane area of the third unit section 282S.

The locations of the shadowing regions in the transparent substrate may be determined by the areas of the unit correction regions 275L, 275M, and 275S of the respective sub-maps (S214). The locations of the shadowing regions will be described with reference to FIG. 9C.

Referring to FIGS. 1, 7, 8A-8C, and 9C, the first, second, and third shadowing regions 282La, 282Ma, and 282Sa that will be formed at the respective first, second, and third unit correction regions 275L, 275M, and 275S may be located in the transparent substrate 100 of the photo mask 110. The plane area of the first shadowing region 282La may be the same as the area of the first unit correction region 275L (or the plane area of the first unit section 282L). The plane area of the second shadowing region 282Ma may be the same as the area of the second unit correction region 275M (or the plane area of the second unit section 282M). The plane area of the third shadowing region 282Sa may be the same as the area of the third unit correction region 275S (or the plane area of the third unit section 282S).

The transparent substrate 100 may include the first and second surfaces 102a and 102b opposite to each other. The mask patterns 105 may be arranged on the first surface 102a.

The first shadowing region 282La may be spaced apart from the first surface 102a of the transparent substrate 100 by a first distance D1. The second shadowing region 282Ma may be spaced apart from the first surface 102a of the transparent substrate 100 by a second distance D2. The third shadowing region 282Sa may be spaced apart from the first surface 102a of the transparent substrate 100 by a third distance D3. That is, the third distance D3 may be smaller than the first and second distances D1 and D2. The first, second, and third shadowing regions 282La, 282Ma, and 282Sa may be substantially parallel with the first surface 102a of the transparent substrate 100.

The densities of the shadowing elements 185 of the shadowing regions that will be formed from the sub-maps may be determined (S216). The first sub-map may include the plurality of the first unit correction regions 275L. Some of the first unit correction regions 275L, which require a same dimension correction amount, may have a same shadowing element density, and some of the first unit correction regions 275L, which require different dimension correction amounts, may have different shadowing element densities. Some of the first unit correction regions 275L, which have a dimension correction amount that is substantially 0 zero may have a shadowing element density that is zero. The required shadowing element densities of respective first unit correction regions 275L are marked in the first unit sections 282L of the first shadowing map 280L, thereby completing the first shadowing map 280L.

Likewise, required shadowing element densities of respective second unit correction regions 275M in the second sub-map are marked in the second unit sections 282M of the second shadowing map 280M, and required shadowing element densities of respective third unit correction regions 275S in the third sub-map require are marked in the third unit sections 282S of the third shadowing map 280S. The shadowing maps 280L, 280M, and 280S may be attained through operations S212-S216.

Next, the shadowing regions may be formed in the transparent substrate 100 of the photo mask 110 using the respective shadowing maps 280L, 280M, and 280S, i.e., operation S220. This will be described with reference to FIG. 9A-9C. FIGS. 9A-9C illustrate cross-sectional views of a method for forming the shadowing regions using the shadowing maps of FIGS. 8A-8C.

Referring to FIGS. 1, 8A, and 9A, the shadowing elements 185 may be formed in the transparent substrate 100 of the photo mask 110 in response to the first shadowing map 280L. Accordingly, the first shadowing region 282La with the shadowing elements 185 may be formed. The first shadowing region 282La may be formed in the transparent substrate 100 and spaced apart from the first surface 102a by the first distance D1. The plane area of the first shadowing region 282La may be the same as that of the first unit section 282L of the first shadowing map 280L. The property and forming method of the shadowing elements 185 may be the same as the above-description with reference to FIGS. 1, 4A, and 5A. The first shadowing map 280L with the first unit sections 282L, i.e., the first shadowing regions 282La, may be formed in the transparent substrate 100. When viewed from a top, the first shadowing regions 282La may have a same arrangement in the transparent substrate 100 as the first unit sections 282L of the first shadowing map 280L of FIG. 8A. The first shadowing regions 282La may be arranged at the first distance D1 from the first surface 102a. The first shadowing regions 282La may have the respective corresponding shadowing element densities of FIG. 8A. The shadowing elements 185 in the first shadowing region 282La may have a first spatial resolution corresponding to the first distance D1. The plane area of the first unit section 282L may be equal to or smaller than the first spatial resolution.

Referring to FIGS. 1, 8B, and 9B, the shadowing elements 185 may be formed in the transparent substrate 100 of the photo mask 110 in accordance with the second shadowing map 280M, thereby forming the second shadowing region 282Ma with the shadowing elements 185. The second shadowing region 282Ma in the transparent substrate 100 may be spaced apart from the first surface 102a by the second distance D2. The second shadowing region 282Ma may have the same plane area as the second unit section 282M of the second shadowing map 280M. The second shadowing region 282Ma may have a smaller plane area than the first shadowing region 282La. Accordingly, the second distance D2 may be smaller than the first distance D1. The second shadowing regions 282Ma may be formed in the transparent substrate 100 by the second shadowing map 280S having the second unit section 282M. When viewed from a top, the second shadowing regions 282Ma may have a same arrangement in the transparent substrate 100 as the second unit sections 282M of the second shadowing map 280M of FIG. 8B. The second shadowing regions 282Ma may be arranged at the second distance D2 from the first surface 102a. The second shadowing regions 282Ma may have the respective corresponding shadowing element densities of FIG. 8B.

The shadowing elements 185 in the second shadowing region 282Ma may have a second spatial resolution corresponding to the second distance D2. The plane area of the second unit section 282M defining the plane area of the second shadowing region 282Ma may be equal to or smaller than the second spatial resolution. The second spatial resolution may be smaller than the first spatial resolution of the shadowing element 185 in the first shadowing region 282La. That is, the second spatial resolution may be more precise than the first spatial resolution.

Referring to FIGS. 1, 8C, and 9C, the shadowing elements 185 may be formed in the transparent substrate 100 of the photo mask 110 in accordance with the third shadowing map 280S, thereby forming the third shadowing region 282Sa. The third shadowing region 282Sa in the transparent substrate 100 may be spaced apart from the first surface 102a by the third distance D3. The third shadowing region 282Sa may have a same plane area as the third unit section 282S of the third shadowing map 280S. The third shadowing region 282Sa may have a smaller plane area than the second shadowing region 282Ma. Accordingly, the third distance D3 may be smaller than the second distance D2. The third distance D3 may be equal to or smaller than about ⅙ of the thickness Ta of the transparent substrate 100.

The third shadowing regions 282Sa may be formed in the transparent substrate 100 by the third shadowing map 280S having the third unit section 282S. When viewed from a top, the third shadowing regions 282Sa may have a same arrangement in the transparent substrate 100 as the third unit sections 282S of the third shadowing map 280S of FIG. 8C. The third shadowing regions 282Sa may be arranged at the second distance D3 from the first surface 102a. The third shadowing regions 282Sa may have the respective corresponding shadowing element densities of FIG. 8C.

The shadowing elements 185 in the third shadowing region 282Sa may have a third spatial resolution corresponding to the third distance D3. The plane area of the third unit section 282S defining the plane area of the third shadowing region 282Sa may be equal to or smaller than the third spatial resolution. The second spatial resolution may be smaller than the second spatial resolution of the shadowing element 185 in the second shadowing region 282Ma.

As described above, the shadowing regions 280La, 280Ma, and 280Sa may be formed in the transparent substrate 100 by sequentially using the shadowing maps 280L, 280M, and 280S. The forming order of the first, second, and third shadowing regions 280La, 280Ma, and 280Sa may be random.

Next, the photolithography process may be performed using the photo mask 110 having the shadowing regions 280La, 280Ma, and 280Sa, thereby defining the patterns on the substrate. As the photo mask 110 has the shadowing regions 280La, 280Ma, and 280Sa, dimensions of the mask patterns 105 of the photo mask 110 and the patterns defined on the substrate may be corrected.

In the exemplary embodiment described with reference to FIGS. 7, 8A-8C, and 9A-9C, the patterns may be corrected by attaining three shadowing maps from the correction amount distribution map. However, the inventive concept is not limited to this. For example, four or more shadowing maps may be attained from the correction amount distribution map to correct the patterns.

According to the embodiments, the shadowing maps may be attained from the correction amount distribution map. At this point, the unit sections of the shadowing maps may have different plane areas. Accordingly, the patterns for the semiconductor device may be precisely corrected at each location. In addition, the correction time may be minimized, and thus, the correction throughput may be improved.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a photo mask, the method comprising:
providing a photo mask substrate having first and second surfaces opposite to each other;
forming mask patterns on the first surface of the photo mask substrate; and
forming a plurality of shadowing regions with shadowing elements in the photo mask substrate, such that distances between the first surface of the photo mask substrate and respective shadowing regions are different from each other.

2. The method as claimed in claim 1, wherein forming the plurality of shadowing regions includes forming the shadowing elements in the shadowing regions with different densities.

3. The method as claimed in claim 1, wherein providing the photo mask substrate includes using a transparent substrate.

4. The method as claimed in claim 3, wherein forming the plurality of shadowing regions includes forming the shadowing elements to have a different refractive index with respect to that of the transparent substrate.

5. The method as claimed in claim 4, wherein forming the plurality of shadowing regions includes forming the shadowing elements to have a greater refractive index than the transparent substrate.

6. The method as claimed in claim 3, wherein forming the shadowing elements includes irradiating laser light into the transparent substrate.

7. A method of fabricating a photo mask, the method comprising:

providing a photo mask substrate having first and second surfaces opposite to each other;

forming mask patterns on the first surface of the photo mask substrate; and forming a plurality of shadowing regions with shadowing elements in the photo mask substrate, such that the shadowing regions include a first shadowing region and a second shadowing region, the first shadowing region being spaced apart from the first surface by a first distance, and the second shadowing region being spaced apart from the first surface by a second distance smaller than the first distance.

8. The method as claimed in claim 7, wherein forming the plurality of shadowing regions includes forming shadowing elements in the shadowing regions with different densities.

9. The method as claimed in claim 7, wherein providing the photo mask substrate includes using a transparent substrate.

10. The method as claimed in claim 9, wherein forming the plurality of shadowing regions includes forming the second distance to be equal to or smaller than ⅙ of a thickness of the transparent substrate.

11. The method as claimed in claim 9, wherein forming the plurality of shadowing regions includes forming the shadowing elements to have a different refractive index with respect to that of the transparent substrate.

12. A method of patterning a semiconductor device, the method comprising:

providing a photo mask substrate having first and second surfaces opposite to each other;

forming mask patterns on the first surface of the photo mask substrate;

forming a plurality of shadowing regions with shadowing elements in the photo mask substrate to form a photo mask, distances between the first surface of the photo mask substrate and respective shadowing regions being different from each other; and defining patterns on a substrate using the photo mask having the shadowing regions.

13. The method as claimed in claim 12, wherein forming the plurality of shadowing regions includes forming shadowing elements in the shadowing regions with different densities.

14. The method as claimed in claim 12, wherein forming the shadowing regions includes forming a first shadowing region and a second shadowing region, the first shadowing region being spaced apart from the first surface by a first distance, and the second shadowing region being spaced apart from the first surface by a second distance smaller than the first distance.

15. The method as claimed in claim 14, wherein providing the photo mask substrate includes using a transparent substrate.

16. The method as claimed in claim 15, wherein forming the plurality of shadowing regions includes forming the second distance to be equal to or smaller than ⅙ of a thickness of the transparent substrate.

17. The method as claimed in claim 15, wherein forming the plurality of shadowing regions includes forming the shadowing elements to have a different refractive index with respect to that of the transparent substrate.

18. The method as claimed in claim 15, wherein forming the shadowing elements includes irradiating laser light into the transparent substrate.

19. The method as claimed in claim 12, wherein, when light for a photolithography process is directed to the second surface of the photo mask, intensity of the light transferred to the mask patterns overlapping the shadowing regions is reduced.

20. The method as claimed in claim 12, further comprising performing a photolithography process on the substrate using the photo mask having the shadowing regions.

* * * * *